(12) United States Patent
Zong et al.

(10) Patent No.: US 12,033,586 B2
(45) Date of Patent: Jul. 9, 2024

(54) DISPLAY PANEL, GATE DRIVE CIRCUIT AND DRIVING METHOD THEREOF

(71) Applicant: BOE Technology Group Co., Ltd., Beijing (CN)

(72) Inventors: Shaolei Zong, Beijing (CN); Wei Sun, Beijing (CN); Rui Liu, Beijing (CN); Jigang Sun, Beijing (CN); Kuanjun Peng, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/273,041

(22) PCT Filed: Aug. 23, 2022

(86) PCT No.: PCT/CN2022/114090
§ 371 (c)(1),
(2) Date: Jul. 19, 2023

(87) PCT Pub. No.: WO2023/051099
PCT Pub. Date: Apr. 6, 2023

(65) Prior Publication Data
US 2024/0153462 A1    May 9, 2024

(30) Foreign Application Priority Data

Sep. 28, 2021 (CN) .......................... 202111146288.X

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0842* (2013.01); *G09G 2310/0286* (2013.01); *G09G 2310/061* (2013.01)

(58) Field of Classification Search
CPC .......... G09G 3/3266; G09G 2300/0842; G09G 2310/0286; G09G 2310/061; G11C 19/28
See application file for complete search history.

(56) References Cited

U.S. PATENT DOCUMENTS

2008/0007296 A1    1/2008  Umezaki
2018/0102102 A1*   4/2018  Su .................. G09G 3/3674
(Continued)

FOREIGN PATENT DOCUMENTS

CN    102214433 A    10/2011
CN    106409207 A     2/2017
(Continued)

OTHER PUBLICATIONS

PCT/CN2022/114090 international search report.
PCT/CN2022/114090 Written Opinion.
CN202111146288X first office action.

*Primary Examiner* — Abhishek Sarma
(74) *Attorney, Agent, or Firm* — IPro, PLLC

(57) ABSTRACT

A display panel, a gate drive circuit and a driving method thereof. The gate drive circuit includes drive units. A first cascaded input end OUT(n−1) of a first shift register (100) of each of the drive units is connected to a different start signal end STV; a plurality of drive units in the drive units include a reset control sub-circuit (9), where the reset control sub-circuit (9) is connected with a second cascaded input end OUT(n+1) of a last shift register (100) and one or more start signal ends STV, and is configured to control an electric potential of the second cascaded input end OUT(n−1) according to an electric potential of the one or more start signal ends STV.

15 Claims, 7 Drawing Sheets

(56) References Cited

U.S. PATENT DOCUMENTS

| | | |
|---|---|---|
| 2018/0122289 A1 | 5/2018 | Gu et al. |
| 2018/0138256 A1 | 5/2018 | Han et al. |
| 2019/0287446 A1 | 9/2019 | Liao et al. |
| 2021/0150969 A1 | 5/2021 | Xie et al. |
| 2022/0343858 A1 | 10/2022 | Feng et al. |

FOREIGN PATENT DOCUMENTS

| | | |
|---|---|---|
| CN | 108389539 A | 8/2018 |
| CN | 109830256 A | 5/2019 |
| CN | 110880304 A | 3/2020 |
| CN | 111210754 A | 5/2020 |
| CN | 111599315 A | 8/2020 |
| CN | 112951140 A | 6/2021 |
| CN | 113851087 A | 12/2021 |
| WO | 2020048305 A1 | 3/2020 |
| WO | 2020224422 A1 | 11/2020 |

\* cited by examiner

DISPLAY PANEL, GATE DRIVE CIRCUIT AND DRIVING METHOD THEREOF

CROSS-REFERENCE TO RELATED APPLICATIONS

This application is a national stage of international PCT Application No. PCT/CN2022/114090 filed on Aug. 23, 2022, the entire contents of which are incorporated herein by reference.

TECHNICAL FIELD

The present disclosure relates to the field of display technology, and in particular, to a display panel, a gate drive circuit and a driving method thereof.

BACKGROUND

A gate drive circuit is an important auxiliary circuit in a display panel. An existing gate drive circuit includes cascaded shift register units. However, a display panel with such gate drive circuit has a low display refresh rate.

SUMMARY

A purpose of the present disclosure is to provide a display panel, a gate drive circuit and a driving method thereof, which can improve a display refresh rate.

According to an aspect of the present disclosure, a gate drive circuit is provided, including:
  drive units, where each of the drive units includes cascaded shift registers; where each of the shift registers includes an input sub-circuit, a first reset sub-circuit and an output sub-circuit;
  where the input sub-circuit is connected with a first cascaded input end and a first node, and is configured to control an electric potential of the first node under control of an electric potential of the first cascaded input end; the output sub-circuit is configured to control an electric potential of a signal output end under control of the electric potential of the first node; the first reset sub-circuit is connected with the first node and a second cascaded input end, and is configured to reset the first node under control of an electric potential of the second cascaded input end;
  where the first cascaded input end of a first shift register of each of the drive units is connected to a different start signal end; one or more drive units in the drive units include a reset control sub-circuit, where the reset control sub-circuit is connected with the second cascaded input end of a last shift register and one or more start signal ends, and is configured to control an electric potential of the second cascaded input end of the last shift register according to an electric potential of the one or more start signal ends; the start signal end connected with the first cascaded input end of the first shift register in one of the one or more drive units is different from the one or more start signal ends connected with the reset control sub-circuit in the one of the one or more drive units.

Further, the reset control sub-circuit includes:
one or more first transistors, where both a control electrode and a first electrode of a first transistor are connected to a same start signal end, and a second electrode of the first transistor is connected to the second cascaded input end of the last shift register.

Further, the input sub-circuit includes:
a second transistor, where a control electrode of the second transistor is connected to the first cascaded input end, a first electrode of the second transistor is connected to a first scan signal end, and a second electrode of the second transistor is connected to the first node.

Further, the first reset sub-circuit includes:
a third transistor, where a control electrode of the third transistor is connected to the second cascaded input end, a first electrode of the third transistor is connected to a second scan signal end, and a second electrode of the third transistor is connected to the first node.

Further, the output sub-circuit includes:
a fourth transistor, where a control electrode of the fourth transistor is connected to the first node, a first electrode of the fourth transistor is connected to a first clock signal end, and a second electrode of the fourth transistor is connected to the signal output end.

Further, the output sub-circuit includes:
a bootstrap capacitor, where a first electrode of the bootstrap capacitor is connected to the first node, and a second electrode of the bootstrap capacitor is connected to the second electrode of the fourth transistor.

Further, the shift register further includes:
a pull-down control sub-circuit connected with a second clock signal end and a second node, and configured to control an electric potential of the second node according to an electric potential of the second clock signal end; and
a pull-down sub-circuit connected with the second node, the signal output end and a power signal end, and configured to control the signal output end to be connected to the power signal end under control of the electric potential of the second node.

Further, the shift register further includes:
a storage sub-circuit connected to the second node, and configured to maintain the electric potential of the second node.

Further, the pull-down control sub-circuit includes a fifth transistor, where both a control electrode and a first electrode of the fifth transistor are connected with the second clock signal end, and a second electrode of the fifth transistor is connected to the second node;
the pull-down sub-circuit includes a sixth transistor, where a control electrode of the sixth transistor is connected with the second node, a first electrode of the sixth transistor is connected with the power signal end, and a second electrode of the sixth transistor is connected to the signal output end; and
the storage sub-circuit includes a storage capacitor, where a first electrode of the storage capacitor is connected with the power signal end, and a second electrode of the storage capacitor is connected with the second node.

Further, the shift register further includes:
a noise-control sub-circuit connected with the first node, the second node and the power signal end, configured to control the second node to be connected to the power signal end under control of the electric potential of the first node, and control the first node to be connected to the power signal end under control of the electric potential of the second node.

Further, the noise-control sub-circuit includes:
a seventh transistor, where a control electrode of the seventh transistor is connected to the second node, a first electrode of the seventh transistor is connected to the power signal end, and a second electrode of the seventh transistor is connected to the first node; and an eighth transistor, where a control electrode of the eighth transistor is connected to the first node, a first electrode of the eighth transistor is connected to the power signal end, and a second electrode of the eighth transistor is connected to the second node.

Further, the shift register further includes:

a second reset sub-circuit connected with the first node, a power signal end and a reset signal end, and configured to control the first node to be connected to the power signal end under control of the reset signal end.

Further, the second reset sub-circuit includes:

a ninth transistor, where a control electrode of the ninth transistor is connected to the reset signal end, a first electrode of the ninth transistor is connected to the power signal end, and a second electrode of the ninth transistor is connected to the second node.

According to an aspect of the present disclosure, a display panel is provided, including the gate drive circuit as described above.

According to an aspect of the present disclosure, a driving method of a gate drive circuit is provided, where the driving method is applied to the gate drive circuit as described above, and the driving method includes:

for the last shift register, driving the input sub-circuit to control the electric potential of the first node under control of the electric potential of the first cascaded input end; driving the output sub-circuit to control the electric potential of the signal output end under control of the electric potential of the first node; driving the reset control sub-circuit to control the electric potential of the second cascaded input end of the last shift register according to the electric potential of the start signal end; and driving the first reset sub-circuit to reset the first node under control of the electric potential of the second cascaded input end.

According to the display panel, the gate drive circuit and the driving method thereof of the present disclosure, the input sub-circuit is configured to control the electric potential of the first node under control of the electric potential of the first cascaded input end, so as to charge the first node; the reset control sub-circuit is connected with the second cascaded input end of the last shift register and one or more start signal ends, and is configured to control the electric potential of the second cascaded input end according to the electric potential of the one or more start signal ends; at the same time, for the drive unit, the start signal end connected with the first cascaded input end of the first shift register is different from the one or more start signal ends connected with the reset control sub-circuit, so that a reset process of the first node of the last shift register of the drive unit can be performed at the same time when a charging process of the first node of the first shift register of another drive unit is performed, thereby reducing display delay of a device and improving a display refresh rate; at the same time, a virtual shift register in related arts does not need to be set, so that limited storage resources in buffers in a display drive chip are saved, and storage area and cost of the buffers in the display drive chip are reduced.

Figure 1:
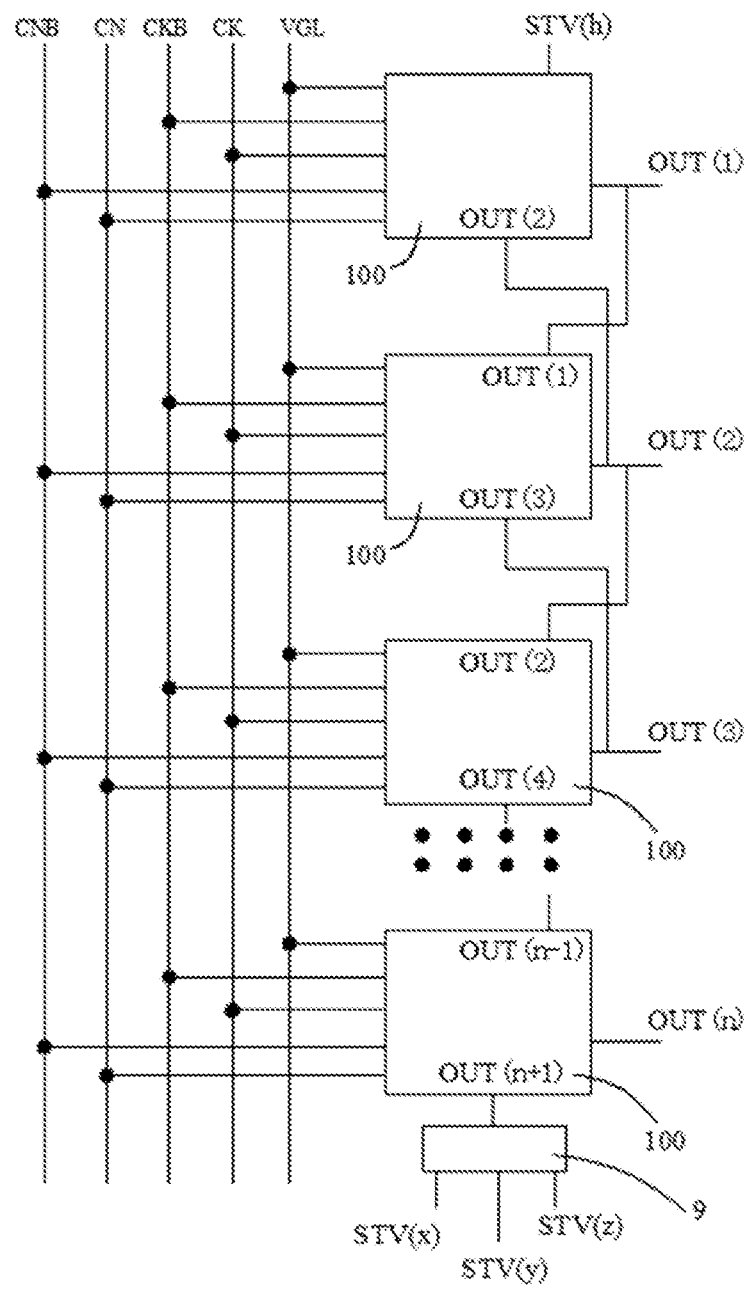
FIG. 1 is a schematic diagram of a drive unit in a gate drive circuit according to an embodiment of the present disclosure.

Reference numerals: 1, input sub-circuit; 2, output sub-circuit; 3, first reset sub-circuit; 4, pull-down control sub-circuit; 5, pull-down sub-circuit; 6, storage sub-circuit; 7, noise-control sub-circuit; 8, second reset sub-circuit; 9, reset control sub-circuit; 100, shifter register.

DETAILED DESCRIPTION

Description will now be made in detail to illustrative embodiments, examples of which are shown in the accompanying drawings. When the following description refers to the drawings, unless otherwise indicated, the same numbers in different drawings indicate the same or similar elements. Embodiments described in the following illustrative embodiments do not represent all embodiments consistent with the present disclosure. In contrary, they are merely examples of apparatuses consistent with some aspects of the present disclosure as described in detail in the appended claims.

The terminologies used in the present disclosure are for the purpose of describing specific embodiments only and are not intended to limit the present disclosure. Unless otherwise defined, technical terms or scientific terms used in the present disclosure shall have their ordinary meanings as understood by those of ordinary skills in the field to which the present disclosure belongs. The "first", "second" and similar words used in the specification and claims of the present disclosure do not indicate any order, quantity or importance, but are only used to distinguish different components. Similarly, similar words such as "a" or "an" do not mean quantity limitation, but mean that there is at least one. "Multiple" or "a plurality of" means two or more. Similar words such as "include" or "comprise" mean that the elements or objects appear before "include" or "comprise" cover the elements or objects listed after "include" or "comprise" and their equivalents, but do not exclude other elements or objects. Similar words such as "connect" or "couple" are not limited to physical or mechanical connection, but may include electrical connection, whether direct or indirect. Singular forms "a", "the" and "said" used in the specification of the present disclosure and the appended claims are also intended to include plural forms, unless the context clearly indicates other meaning. It should also be understood that the term "and/or" as used herein refers to and includes any or all possible combinations of one or more associated listed items.

Transistors used in the present disclosure may be triodes, thin film transistors or field effect transistors or other devices with same characteristics. In an embodiment of the present disclosure, in order to distinguish two electrodes of a transistor other than a control electrode, one of the two electrodes is referred to as a first electrode and the other one is referred to as a second electrode.

In actual operation, when the transistor is a triode, the control electrode may be a base electrode, the first electrode may be a collector electrode, and the second electrode may be an emitter electrode; alternatively, the control electrode may be a base electrode, the first electrode may be an emitter electrode, and the second electrode may be a collector electrode.

In actual operation, when the transistor is a thin film transistor or a field effect transistor, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

In related arts, amount of data displayed by a light field is large. In order to save display resources, a gate drive circuit arranged in a peripheral area of a display panel is usually divided into drive units. Each of the drive units includes cascaded shift registers. A last shift register in the cascaded shift registers is a virtual shift register, and other shift registers are valid shift registers. The valid shift registers are connected to pixel rows on the display panel. The virtual shift register is not connected to a pixel row on the display panel, and serves to reset a previous valid shift register. In a displaying process of the display panel, a display drive chip needs to drive multiple drive units. After a driving process of a drive unit is finished, if the virtual shift register in the drive unit resets the previous valid shift register, a next drive unit can be switched to. In such process, a buffer of the display drive chip needs to store a dislocation problem of data rows caused by the virtual shift register; at the same time, since all drive units are provided with virtual shift registers, storage area and cost of the buffer of the display drive chip are increased. In addition, the virtual shift register is not connected to a pixel row, and occupies display time, increases display delay of a device, and reduces a display refresh rate during operation.

Figure 2:
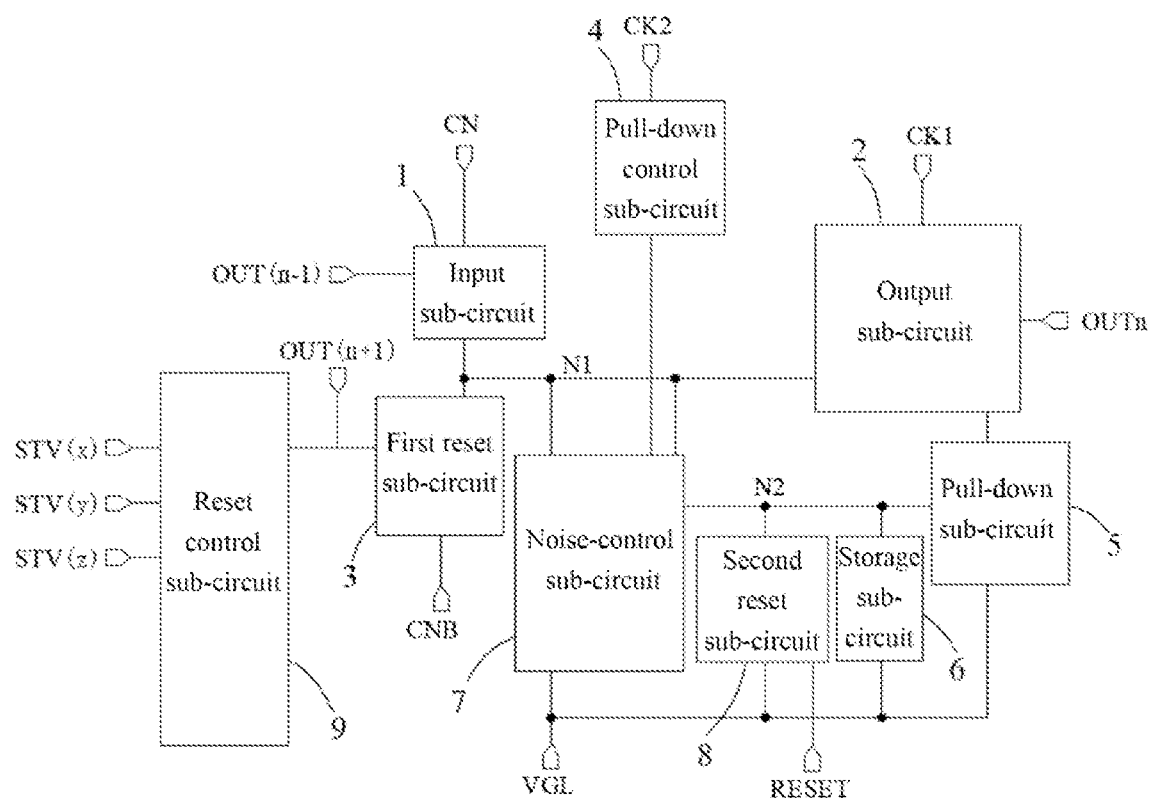
FIG. 2 is a block diagram of a shift register in a drive unit according to an embodiment of the present disclosure.
Figure 3:
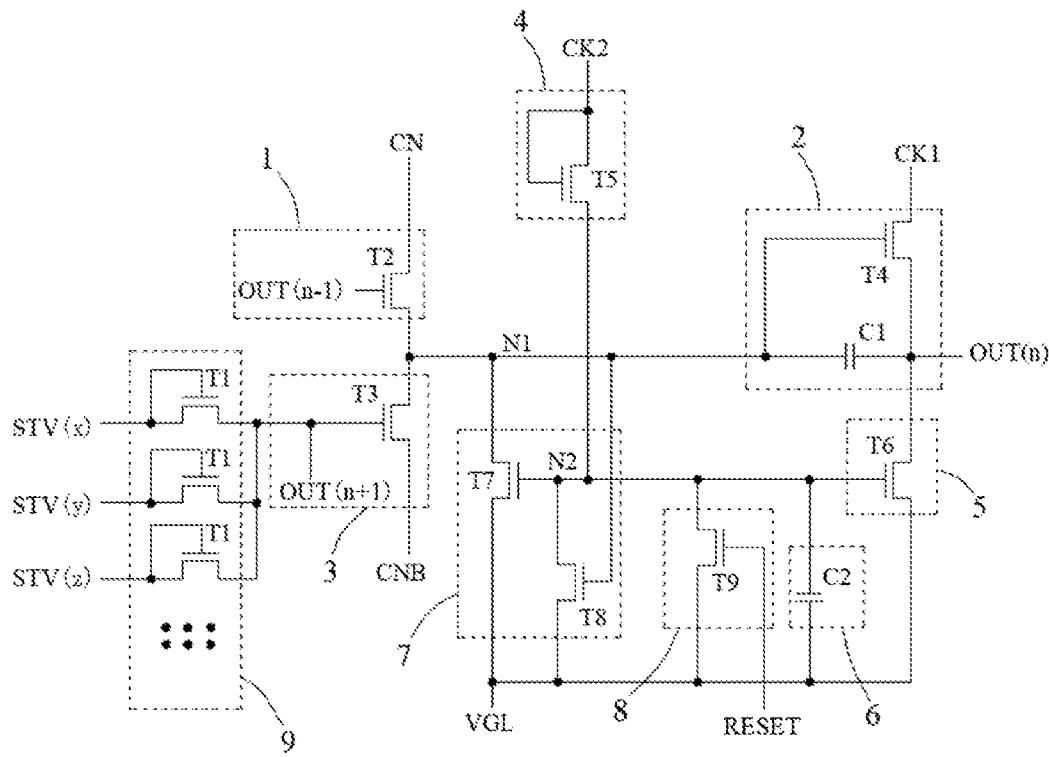
FIG. 3 is a circuit diagram of a shift register in a drive unit according to an embodiment of the present disclosure.

An embodiment of the present disclosure provides a gate drive circuit. As shown in FIG. 1, the gate drive circuit may include drive units. Each of the drive units may include cascaded shift registers 100. As shown in FIGS. 2 and 3, each of the shift registers 100 may include an input sub-circuit 1, a first reset sub-circuit 3 and an output sub-circuit 2, where the input sub-circuit 1 may be connected with a first cascaded input end OUT(n−1) and a first node N1, and may be configured to control an electric potential of the first node N1 under control of an electric potential of the first cascaded input end OUT(n−1). The output sub-circuit 2 is configured to control an electric potential of a signal output end OUT(n) under control of the electric potential of the first node N1. The first reset sub-circuit 3 is connected with the first node N1 and a second cascaded input end OUT(n+1), and is configured to reset the first node N1 under control of an electric potential of the second cascaded input end OUT(n+1).

The first cascaded input end OUT(n−1) of a first shift register 100 in each of the drive units is connected to a different start signal end STV. One or more drive units in the multiple drive units include a reset control sub-circuit 9. The reset control sub-circuit 9 is connected with the second cascaded input end OUT(n+1) of a last shift register 100 and one or more start signal ends STV, and is configured to control an electric potential of the second cascaded input end OUT(n+1) according to an electric potential of the one or more start signal ends STV. For a drive unit, the start signal end STV connected with the first cascaded input end OUT(n−1) of the first shift register 100 is different from the one or more start signal ends STV connected to the reset control sub-circuit 9.

According to the gate drive circuit of the embodiments of the present disclosure, the input sub-circuit 1 is configured to control the electric potential of the first node N1 under control of the electric potential of the first cascaded input end OUT(n−1), so as to charge the first node N1; the reset control sub-circuit 9 is connected with the second cascaded input end OUT(n+1) of the last shift register 100 and one or more start signal ends STV, and is configured to control the electric potential of the second cascaded input end OUT(n+1) according to the electric potential of the one or more start signal ends STV; at the same time, for the drive unit, the start signal end STV connected with the first cascaded input end OUT(n−1) of the first shift register 100 is different from the one or more start signal ends STV connected with the reset control sub-circuit 9, so that a reset process of the first node N1 of the last shift register 100 of the drive unit can be performed at the same time when a charging process of the first node N1 of the first shift register 100 of another drive unit is performed, thereby reducing display delay of a device and improving a display refresh rate; at the same time, a virtual shift register 100 in related arts does not need to be set, so that storage resources in buffers in a display drive chip are saved, and storage area and cost of the buffers in the display drive chip are reduced.

Each part of the shift register unit according to the embodiment of the present disclosure will be described in detail below.

As shown in FIGS. 2 and 3, the input sub-circuit 1 is configured to control the electric potential of the first node N1. The input sub-circuit 1 can be connected with the first node N1, a first scan signal end CN and the first cascaded input end OUT(n−1). The input sub-circuit 1 is configured to control the first scan signal end CN to be connected to the first node N1 under control of the electric potential of the first cascaded input end OUT(n−1). For example, the input sub-circuit 1 may include a second transistor T2. A control electrode of the second transistor T2 is connected to the first cascaded input end OUT(n−1), a first electrode of the second transistor T2 is connected to the first scan signal end CN, and a second electrode of the second transistor T2 is connected to the first node N1.

As shown in FIGS. 2 and 3, the first reset sub-circuit 3 is connected with the first node N1, a second scan signal end CNB and the second cascaded input end OUT(n+1), and is configured to control the first node N1 to be connected to the second scan signal end CNB under control of the electric potential of the second cascaded input end OUT(n+1), so as to reset the first node N1. For example, the first reset sub-circuit 3 may include a third transistor T3. A control electrode of the third transistor T3 is connected to the second cascaded input end OUT(n+1), a first electrode of the third transistor T3 is connected to the second scan signal end CNB, and a second electrode of the third transistor T3 is connected to the first node N1.

As shown in FIGS. 2 and 3, the output sub-circuit 2 is configured to control an electric potential of a signal output end OUT(n) under control of the electric potential of the first node N1. The output sub-circuit 2 is connected with the signal output end OUT(n), the first node N1 and a first clock signal end CK1, and is configured to control the signal output end OUT(n) to be connected to the first clock signal end CK1 under control of the electric potential of the first node N1. For example, the output sub-circuit 2 may include a fourth transistor T4. A control electrode of the fourth transistor T4 is connected to the first node N1, a first electrode of the fourth transistor T4 is connected to the first clock signal end CK1, and a second electrode of the fourth transistor T4 is connected to the signal output end OUT(n). In addition, the output sub-circuit 2 may further include a bootstrap capacitor C1. A first electrode of the bootstrap capacitor C1 is connected to the first node N1, and a second electrode of the bootstrap capacitor C1 is connected to the second electrode of the fourth transistor T4. When the fourth transistor T4 is in an open state and the first clock signal end CK1 is at a high electric level, the arranged bootstrap capacitor C1 can increase the electric potential of the first node N1, so as to further open the fourth transistor T4.

As shown in FIGS. 2 and 3, the shift register 100 of the embodiment of the present disclosure may further include a pull-down control sub-circuit 4 and a pull-down sub-circuit 5. The pull-down control sub-circuit 4 may be connected with a second clock signal end CK2 and a second node N2, and may be configured to control an electric potential of the second node N2 according to an electric potential of the second clock signal end CK2. The pull-down control sub-circuit 4 may include a fifth transistor T5. Both a control electrode and a first electrode of the fifth transistor T5 are connected with the second clock signal end CK2, and a second electrode of the fifth transistor T5 is connected to the second node N2. The pull-down sub-circuit 5 is connected with the second node N2, the signal output end OUT(n) and a power signal end VGL, and is configured to control the signal output end OUT(n) to be connected to the power signal end VGL under control of the electric potential of the second node N2. For example, the power signal end VGL can output low voltage constantly. The pull-down sub-circuit 5 includes a sixth transistor T6. A control electrode of the sixth transistor T6 is connected to the second node N2, a first electrode of the sixth transistor T6 is connected to the power signal end VGL, and a second electrode of the sixth transistor T6 is connected to the signal output end OUT(n). The shift register 100 of the embodiment of the present disclosure may further include a storage sub-circuit 6. The storage sub-circuit 6 is connected to the second node N2, and is configured to maintain the electric potential of the second node N2. The storage sub-circuit 6 may include a storage capacitor C2, where a first electrode of the storage capacitor C2 is connected with the power signal end VGL, and a second electrode of the storage capacitor C2 is connected with the second node N2.

As shown in FIGS. 2 and 3, the shift register 100 of the embodiment of the present disclosure may further include a noise-control sub-circuit 7. The noise-control sub-circuit 7 is connected with the first node N1, the second node N2 and the power signal end VGL, and is configured to control the second node N2 to be connected to the power signal end VGL under control of the electric potential of the first node N1, and control the first node N1 to be connected to the power signal end VGL under control of the electric potential of the second node N2. For example, the noise-control sub-circuit 7 may include a seventh transistor T7 and an eighth transistor T8. A control electrode of the seventh transistor T7 is connected to the second node N2, a first electrode of the seventh transistor T7 is connected to the power signal end VGL, and a second electrode of the seventh transistor T7 is connected to the first node N1. A control electrode of the eighth transistor T8 is connected to the first node N1, a first electrode of the eighth transistor T8 is connected to the power signal end VGL, and a second electrode of the eighth transistor T8 is connected to the second node N2.

As shown in FIGS. 2 and 3, the shift register 100 of the embodiment of the present disclosure may further include a second reset sub-circuit 8. The second reset sub-circuit 8 is connected to the first node N1, the power signal end VGL and a reset signal end RESET, and is configured to control the first node N1 to be connected to the power signal end VGL under control of the reset signal end RESET. For example, the second reset sub-circuit 8 may include a ninth transistor T9. A control electrode of the ninth transistor T9 is connected to the reset signal end RESET, a first electrode of the ninth transistor T9 is connected to the power signal end VGL, and a second electrode of the ninth transistor T9 is connected to the second node N2.

Figure 4:
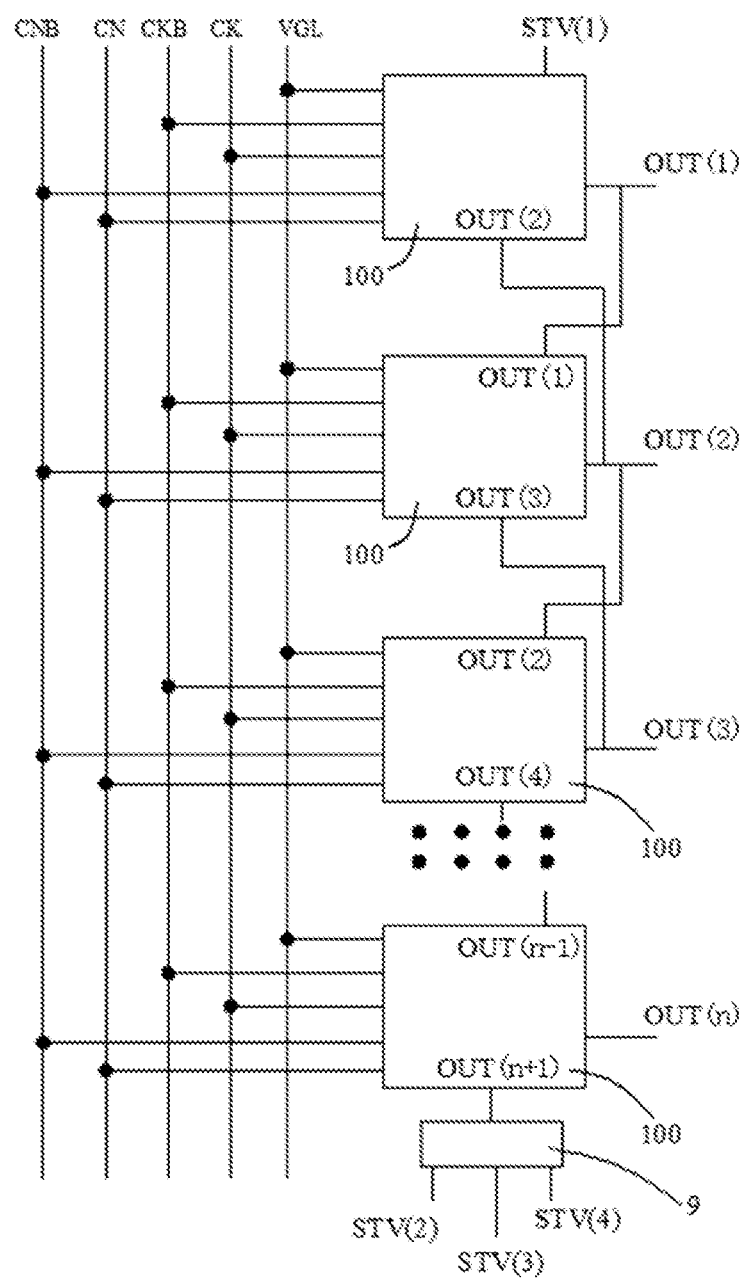
FIG. 4 is a schematic diagram of a first drive unit in a gate drive circuit according to an embodiment of the present disclosure.
Figure 5:
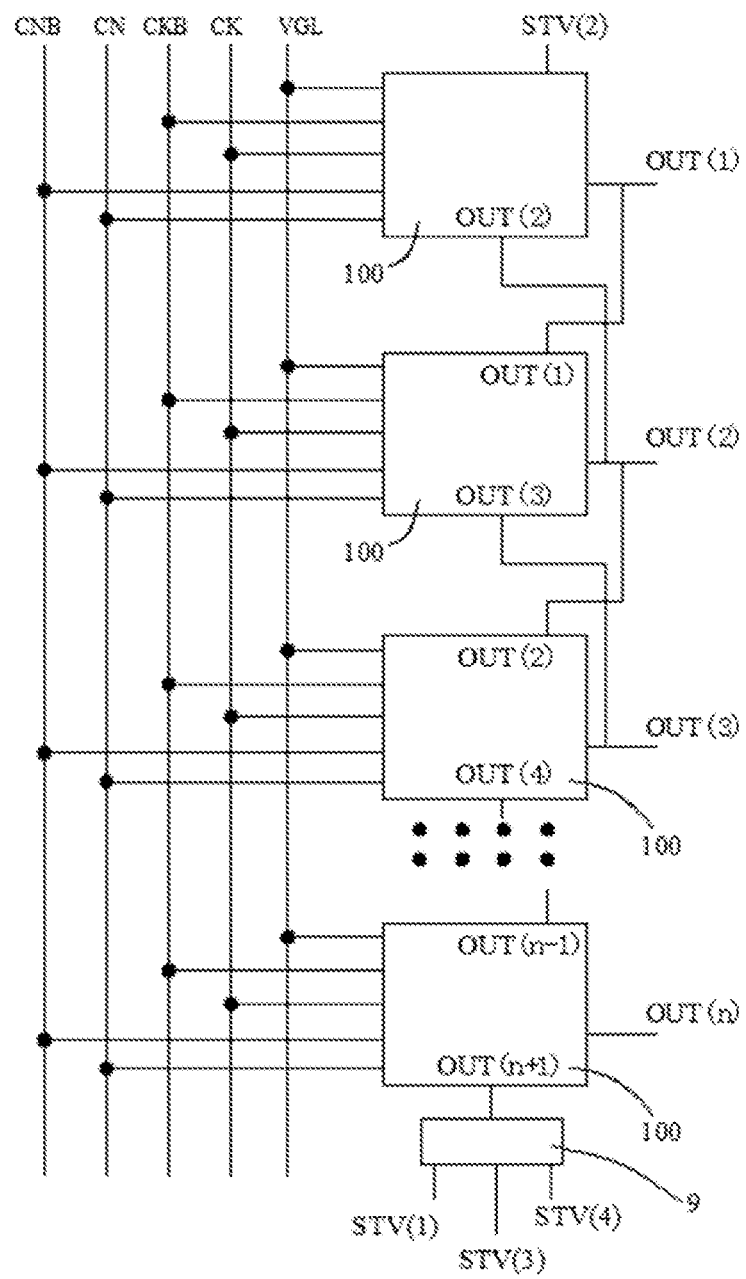
FIG. 5 is a schematic diagram of a second drive unit in a gate drive circuit according to an embodiment of the present disclosure.
Figure 6:
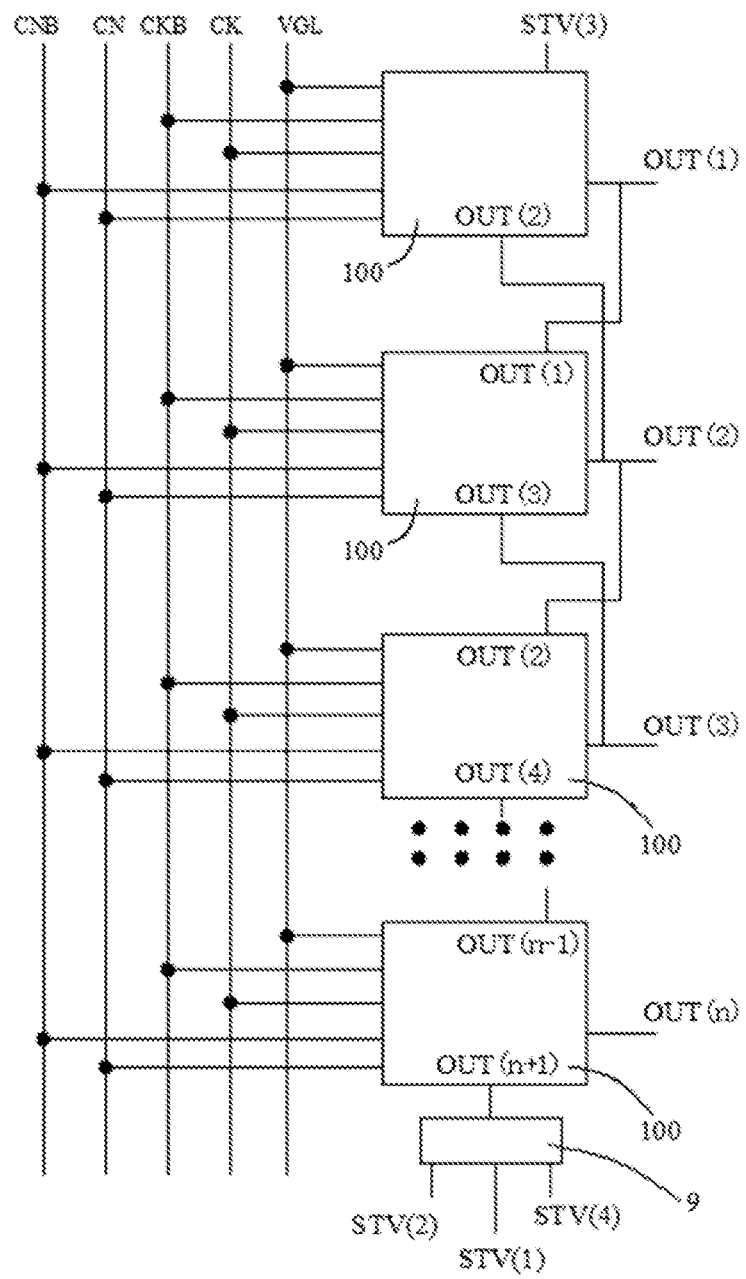
FIG. 6 is a schematic diagram of a third drive unit in a gate drive circuit according to an embodiment of the present disclosure.
Figure 7:
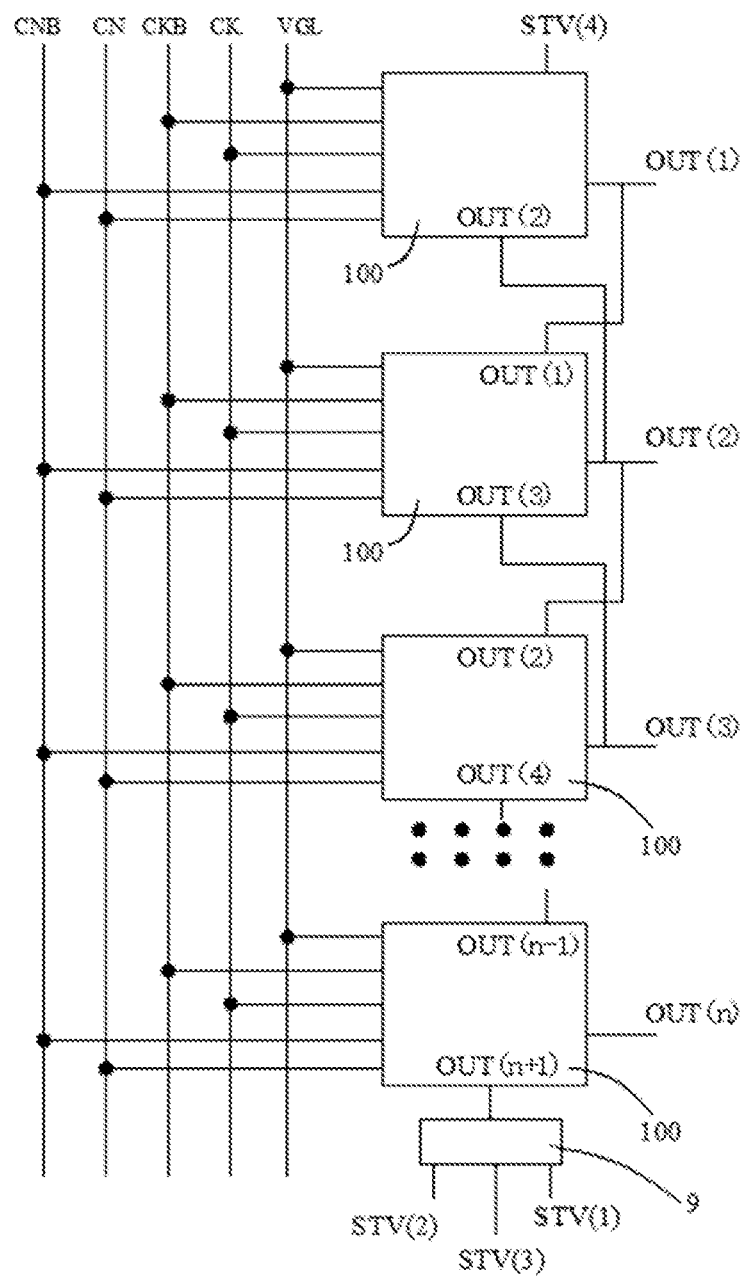
FIG. 7 is a schematic diagram of a fourth drive unit in a gate drive circuit according to an embodiment of the present disclosure.

The first cascaded input end OUT(n−1) of the first shift register 100 in each of the drive units is connected to a different start signal end STV. It is taken as an example that the gate drive circuit includes 4 drive units. The four drive units may include a first drive unit, a second drive unit, a third drive unit and a fourth drive unit. As shown in FIG. 4, the first cascaded input end OUT(n−1) of the first shift register 100 in the first drive unit is connected to a first start signal end STV1, that is, STV(h) in FIG. 1 is the STV1; as shown in FIG. 5, the first cascaded input end OUT(n−1) of the first shift register 100 in the second drive unit is connected to a second start signal end STV2, that is, STV(h) in FIG. 1 is the STV2; as shown in FIG. 6, the first cascaded input end OUT(n−1) of the first shift register 100 in the third drive unit is connected to a third start signal end STV3, that is, STV(h) in FIG. 1 is the STV3; as shown in FIG. 7, the first cascaded input end OUT(n−1) of the first shift register 100 in the fourth drive unit is connected to a fourth start signal end STV4, that is, STV(h) in FIG. 1 is the STV4.

One or more drive units in the multiple drive units include a reset control sub-circuit 9. Further, all drive units include the reset control sub-circuit 9. The reset control sub-circuit 9 is connected with the second cascaded input end OUT(n+1) of a last shift register 100 and one or more start signal ends STV, and is configured to control an electric potential of the second cascaded input end OUT(n+1) according to an electric potential of the one or more start signal ends STV. The one or more start signal ends STV may include STV(x), STV(y), STV(z), etc. For any drive unit, the start signal end STV connected with the first cascaded input end OUT(n−1) of the first shift register 100 is different from the one or more start signal ends STV connected to the reset control sub-circuit 9, and the one or more start signal ends STV connected to the reset control sub-circuit 9 is same as a start signal end STV connected to the first shift register 100 of at least one drive unit in other drive units.

It is taken as an example that the reset control sub-circuit 9 is connected with multiple start signal ends STV, and the reset control sub-circuit 9 may include 3 first transistors T1; for the first drive unit, as shown in FIG. 4, both of a control electrode and a first electrode of a first transistor T1 are connected to the second start signal end STV2, both of a control electrode and a first electrode of another first transistor T1 are connected to the third start signal end STV3, and both of a control electrode and a first electrode of a last first transistor T1 are connected to the fourth start signal end STV4, and second electrodes of all of the 3 first transistors T1 are connected to the second cascaded input end OUT(n+1) of the last shift register 100. For the second drive unit, as shown in FIG. 5, both of a control electrode and a first electrode of a first transistor T1 are connected to the first start signal end STV1, both of a control electrode and a first electrode of another first transistor T1 are connected to the third start signal end STV3, and both of a control electrode and a first electrode of a last first transistor T1 are connected to the fourth start signal end STV4. For the third drive unit, as shown in FIG. 6, both of a control electrode and a first electrode of a first transistor T1 are connected to the second start signal end STV2, both of a control electrode and a first electrode of another first transistor T1 are connected to the first start signal end STV1, and both of a control electrode and a first electrode of a last first transistor T1 are connected to the fourth start signal end STV4. For the fourth drive unit, as shown in FIG. 7, both of a control electrode and a first electrode of a first transistor T1 are connected to the second start signal end STV2, both of a control electrode and a first electrode of another first transistor T1 are connected to the first start signal end STV3, and both of a control electrode and a first electrode of a last first transistor T1 are connected to the first start signal end STV1. In addition, the first transistors T1 may be replaced with diodes, where an anode of a diode may be connected to the start signal end STV, a cathode of the diode may be connected to the second cascaded input end OUT(n+1) of the last shift register 100.

It is to be noted that, when the reset control sub-circuit 9 is only connected to one start signal end STV, the reset control sub-circuit 9 may be a conductive wire to connect the second cascaded input end OUT(n+1) of the last shift register 100 and the start signal end STV.

An embodiment of the present disclosure further provides a driving method of a gate drive circuit. The driving method may adopt the gate drive circuit according to any embodiment mentioned above. The driving method may include: for the last shift register 100, driving the input sub-circuit 1 to control the electric potential of the first node N1 under control of the electric potential of the first cascaded input end OUT(n−1); driving the output sub-circuit 2 to control the electric potential of the signal output end OUT(n) under control of the electric potential of the first node N1; driving the reset control sub-circuit 9 to control the electric potential of the second cascaded input end OUT(n+1) of the last shift register 100 according to the electric potential of the start signal end STV; driving the first reset sub-circuit 3 to reset the first node N1 under control of the electric potential of the second cascaded input end OUT(n+1).

With reference to the circuit sequence diagram shown in FIG. 8, an operation process of the gate drive circuit provided by the present disclosure will be described. Respective shift register units in the gate drive circuit are correspondingly connected to respective pixel rows in a display panel. All transistors in the gate drive circuit are N-type transistors.

Figure 8:
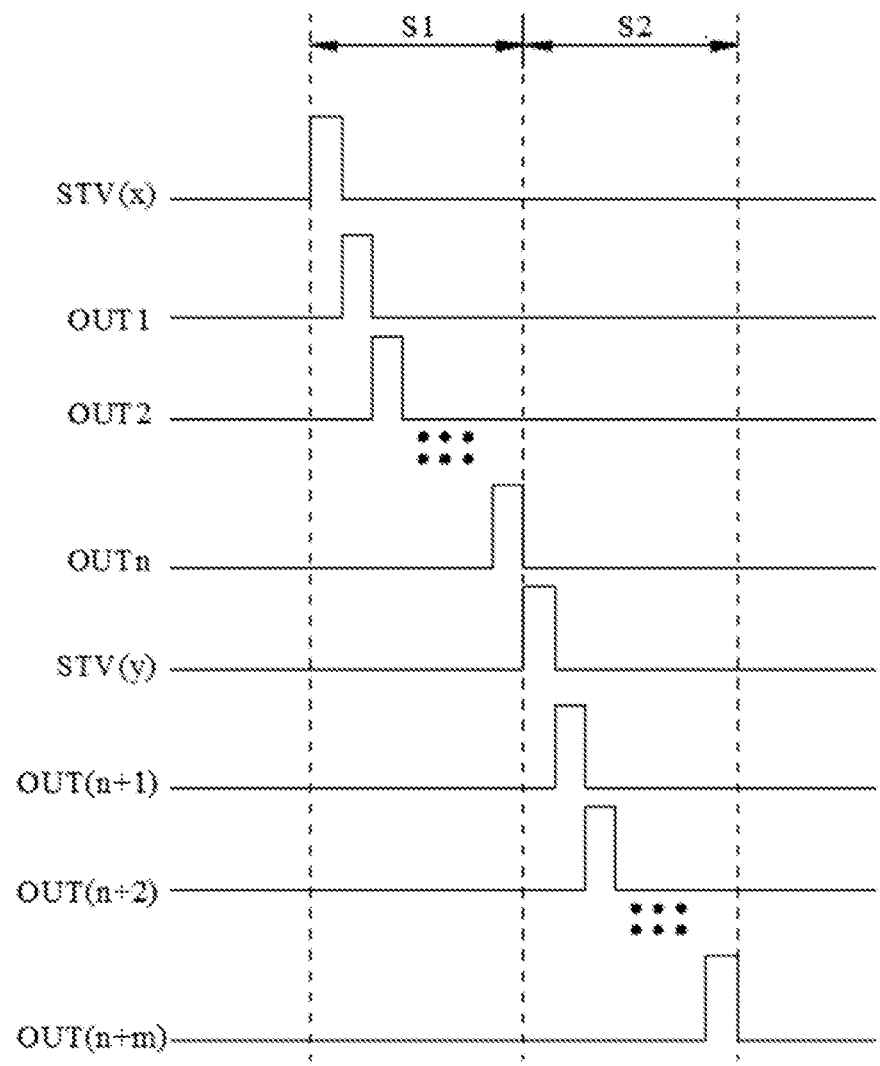
FIG. 8 is an operating sequence diagram of a gate drive unit according to an embodiment of the present disclosure.

As shown in FIG. 8, for any two drive units in the gate drive circuit, a first cascaded output end OUT(n−1) in a first shift register 100 in one drive unit is connected to a start signal end STV(x), and both a first electrode and a control electrode of a reset transistor of the drive unit are connected to a start signal end STV(y); a first cascaded input end OUT(n−1) of a first shift register 100 of another drive unit is connected to the start signal end STV(y).

As shown in FIG. 8, a first stage S1 corresponds to an operation process of one drive unit. When the start signal end STV(x) is at a high electric level, a second transistor T2 is opened, and signal output ends OUT(n) of respective shift registers 100 output high electric levels in sequence, so as to scan a plurality of pixel rows row by row. For the first to the second-from-last shift registers 100, a second cascaded input end OUT(n+1) of each of the respective shift registers receives a high electric level output by a signal output end OUT(n) of a next shift register 100, so as to reset the first node N1.

As shown in FIG. 8, a second stage S2 corresponds to an operation process of another drive unit. When the start signal end STV(y) is at a high electric level, since both a first electrode and a control electrode of a reset transistor of a previous drive unit are connected to the start signal end STV(y), the reset transistor is opened, so as to drive the second cascaded input end OUT(n+1) of the last shift register 100 of the previous drive unit to write a high electric level, so as to reset the first node N1 of the last shift register 100 of the previous drive unit.

An embodiment of the present disclosure further provides a display panel. The display panel may include the gate drive circuit of any embodiment mentioned above. The display panel may be an OLED (Organic Light-Emitting Diode) display panel, which is not specifically limited by the embodiments of the present disclosure.

The display panel, the gate drive circuit and the driving method thereof provided by the embodiments of the present disclosure belong to a same inventive concept, and description of related details and advantageous effects can be referred to from each other, which will not be repeated.

The above are only preferred embodiments of the present disclosure, and they do not limit the present disclosure in any form. Although the present disclosure has been disclosed in the preferred embodiments, they are not used to limit the present disclosure. Any person familiar with this profession can make some changes or modify it into an equivalent embodiment by using the technical content disclosed above without departing from the scope of the technical solution of the present disclosure. So long as the content does not depart from the technical solution of the present disclosure, any simple modifications, equivalent changes or modifications made to the above embodiments according to the technical essence of the present disclosure belong to the scope of the technical solution of the present disclosure.

The invention claimed is:

1. A gate drive circuit, comprising:
   drive units, wherein each of the drive units comprises cascaded shift registers; wherein each of the shift registers comprises an input sub-circuit, a first reset sub-circuit and an output sub-circuit;
   wherein the input sub-circuit is connected with a first cascaded input end and a first node, and is configured to control an electric potential of the first node under control of an electric potential of the first cascaded input end; the output sub-circuit is configured to control an electric potential of a signal output end under control of the electric potential of the first node; the first reset sub-circuit is connected with the first node and a second cascaded input end, and is configured to reset the first node under control of an electric potential of the second cascaded input end;
   wherein the first cascaded input end of a first shift register of each of the drive units is connected to a different start signal end; one or more drive units in the drive units comprise a reset control sub-circuit, wherein the reset control sub-circuit is connected with the second cascaded input end of a last shift register and one or more start signal ends, and is configured to control an electric potential of the second cascaded input end of the last shift register according to an electric potential of the one or more start signal ends; the start signal end connected with the first cascaded input end of the first shift register in one of the one or more drive units is different from the one or more start signal ends connected with the reset control sub-circuit in the one of the one or more drive units.

2. The gate drive circuit according to claim 1, wherein the reset control sub-circuit comprises:
one or more first transistors, wherein both a control electrode and a first electrode of a first transistor are connected to a same start signal end, and a second electrode of the first transistor is connected to the second cascaded input end of the last shift register.

3. The gate drive circuit according to claim 1, wherein the input sub-circuit comprises:
a second transistor, wherein a control electrode of the second transistor is connected to the first cascaded input end, a first electrode of the second transistor is connected to a first scan signal end, and a second electrode of the second transistor is connected to the first node.

4. The gate drive circuit according to claim 1, wherein the first reset sub-circuit comprises:
a third transistor, wherein a control electrode of the third transistor is connected to the second cascaded input end, a first electrode of the third transistor is connected to a second scan signal end, and a second electrode of the third transistor is connected to the first node.

5. The gate drive circuit according to claim 1, wherein the output sub-circuit comprises:
a fourth transistor, wherein a control electrode of the fourth transistor is connected to the first node, a first electrode of the fourth transistor is connected to a first clock signal end, and a second electrode of the fourth transistor is connected to the signal output end.

6. The gate drive circuit according to claim 5, wherein the output sub-circuit further comprises:
a bootstrap capacitor, wherein a first electrode of the bootstrap capacitor is connected to the first node, and a second electrode of the bootstrap capacitor is connected to the second electrode of the fourth transistor.

7. The gate drive circuit according to claim 1, wherein a shift register further comprises:
a pull-down control sub-circuit connected with a second clock signal end and a second node, and configured to control an electric potential of the second node according to an electric potential of the second clock signal end; and
a pull-down sub-circuit connected with the second node, the signal output end and a power signal end, and configured to control the signal output end to be connected to the power signal end under control of the electric potential of the second node.

8. The gate drive circuit according to claim 7, wherein the shift register further comprises:
a storage sub-circuit connected to the second node, and configured to maintain the electric potential of the second node.

9. The gate drive circuit according to claim 8, wherein the pull-down control sub-circuit comprises a fifth transistor, wherein both a control electrode and a first electrode of the fifth transistor are connected with the second clock signal end, and a second electrode of the fifth transistor is connected to the second node;
the pull-down sub-circuit comprises a sixth transistor, wherein a control electrode of the sixth transistor is connected with the second node, a first electrode of the sixth transistor is connected with the power signal end, and a second electrode of the sixth transistor is connected to the signal output end; and
the storage sub-circuit comprises a storage capacitor, wherein a first electrode of the storage capacitor is connected with the power signal end, and a second electrode of the storage capacitor is connected with the second node.

10. The gate drive circuit according to claim 7, wherein the shift register further comprises:
a noise-control sub-circuit connected with the first node, the second node and the power signal end, configured to control the second node to be connected to the power signal end under control of the electric potential of the first node, and control the first node to be connected to the power signal end under control of the electric potential of the second node.

11. The gate drive circuit according to claim 10, wherein the noise-control sub-circuit comprises:
a seventh transistor, wherein a control electrode of the seventh transistor is connected to the second node, a first electrode of the seventh transistor is connected to the power signal end, and a second electrode of the seventh transistor is connected to the first node; and
an eighth transistor, wherein a control electrode of the eighth transistor is connected to the first node, a first electrode of the eighth transistor is connected to the power signal end, and a second electrode of the eighth transistor is connected to the second node.

12. The gate drive circuit according to claim 1, wherein a shift register further comprises:
a second reset sub-circuit connected with the first node, a power signal end and a reset signal end, and configured to control the first node to be connected to the power signal end under control of the reset signal end.

13. The gate drive circuit according to claim 12, wherein the second reset sub-circuit comprises:
a ninth transistor, wherein a control electrode of the ninth transistor is connected to the reset signal end, a first electrode of the ninth transistor is connected to the power signal end, and a second electrode of the ninth transistor is connected to the second node.

14. A display panel, comprising the gate drive circuit according to claim 1.

15. A driving method of a gate drive circuit, wherein the driving method is applied to the gate drive circuit according to claim 1, and the driving method comprises:
for the last shift register,
driving the input sub-circuit to control the electric potential of the first node under control of the electric potential of the first cascaded input end;
driving the output sub-circuit to control the electric potential of the signal output end under control of the electric potential of the first node;
driving the reset control sub-circuit to control the electric potential of the second cascaded input end of the last shift register according to the electric potential of the start signal end; and
driving the first reset sub-circuit to reset the first node under control of the electric potential of the second cascaded input end.

* * * * *